United States Patent
Ito et al.

(10) Patent No.: US 10,831,113 B1
(45) Date of Patent: Nov. 10, 2020

(54) STAGE MECHANISM AND TABLE HEIGHT POSITION ADJUSTMENT METHOD

(71) Applicant: NuFlare Technology, Inc., Yokohama (JP)

(72) Inventors: Hideki Ito, Yokohama (JP); Takahiro Murata, Sagamihara (JP); Toshikatsu Akiba, Kisarazu (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/832,773

(22) Filed: Mar. 27, 2020

(30) Foreign Application Priority Data

Apr. 24, 2019 (JP) .................................. 2019-082399

(51) Int. Cl.
*G03B 27/58* (2006.01)
*G03F 7/20* (2006.01)

(52) U.S. Cl.
CPC ...... *G03F 7/70775* (2013.01); *G03F 7/70716* (2013.01); *H01J 2237/20235* (2013.01)

(58) Field of Classification Search
CPC .............. G03F 7/70775; G03F 7/70716; H01J 2237/20235
See application file for complete search history.

(56) References Cited

U.S. PATENT DOCUMENTS

| 5,640,227 A * | 6/1997 | Kato ..................... G03F 9/7026 355/53 |
| 2001/0002303 A1* | 5/2001 | Yuan ................... G03F 7/70716 430/30 |

FOREIGN PATENT DOCUMENTS

| JP | 7-35987 A | 2/1995 |
| JP | 7-245257 A | 9/1995 |
| JP | 6254060 B2 * | 12/2017 |

\* cited by examiner

*Primary Examiner* — Peter B Kim
(74) *Attorney, Agent, or Firm* — Oblon, McClelland, Maier & Neustadt, L.L.P.

(57) ABSTRACT

A stage mechanism includes a wedge with an inclined surface having a predetermined angle with respect to a horizontal direction, a roller relatively rolling on the inclined surface of the wedge by relative horizontal movement of the wedge, a fine movement mechanism supporting the roller, going up and down in accordance with up and down movement of the roller which relatively rolls on the inclined surfaces by the relative horizontal movement of the wedge, and capable of going up and down more finely than the up and down movement of the roller, a table supported by the fine movement mechanism, and an elastic body connected to the table, restraining horizontal movement of the table, and applying an elastic force, in at least one of upward and downward directions, to the table.

10 Claims, 15 Drawing Sheets

STAGE MECHANISM AND TABLE HEIGHT POSITION ADJUSTMENT METHOD

CROSS-REFERENCE TO RELATED APPLICATION

This application is based upon and claims the benefit of priority from prior Japanese Patent Application No. 2019-082399 filed on Apr. 24, 2019 in Japan, the entire contents of which are incorporated herein by reference.

BACKGROUND OF THE INVENTION

Field of the Invention

Embodiments of the present invention relate to a stage mechanism and a table height position adjustment method. For example, they relate to a stage mechanism installed in an inspection apparatus for inspecting a pattern by using a secondary electron image of the pattern emitted by irradiation with multiple electron beams, and to a method of adjusting a table height position of the stage in the mechanism.

In recent years, with the advance of high integration and large capacity of LSI (Large Scale Integrated circuits), the line width (critical dimension) required for circuits of semiconductor elements is becoming progressively narrower. Since LSI manufacturing requires a tremendous amount of manufacturing cost, it is crucially essential to improve its yield. However, as typified by a 1-gigabit DRAM (Dynamic Random Access Memory), the scale of patterns configuring an LSI is in transition from on the order of sub-microns to on the order of nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultra fine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After performing alignment between images, the comparison circuit compares the measured data with reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with primary electron beams and detecting secondary electrons emitted from the inspection substrate due to the irradiation with the primary electron beams. For example, in semiconductor wafer inspection, as the size of the wafer increases, the mounting table also increases in size. On the other hand, as the critical dimension in the design rule for wiring becomes narrower, improvement in inspection accuracy is required. Then, for improving the inspection accuracy, it is necessary to increase accuracy of focusing laser beams or electron beams. Further, for increasing the accuracy of focusing laser beams or electron beams, the height position of the stage to mount a substrate thereon needs to be highly accurately adjusted and controlled.

Although not with respect to the stage of an inspection apparatus, there is disclosed a configuration regarding the stage of a projection exposure apparatus which performs exposure transferring of a mask image onto the substrate. According to this configuration, the intermediate table (fine adjustment base) on the wedge (or shim) is moved in the vertical direction by diagonally moving the wedge by an encoder servo system, and a table disposed on a plurality of piezoelectric elements arranged on the intermediate table is moved up and down by driving the plurality of piezoelectric elements by a magnetic sensor servo system (e.g., refer to Japanese Patent Application Laid-open (JP-A) No. 7-245257). With this mechanism, since the large wedge-like member is moved by the encoder servo system, and further, the intermediate table is disposed on the large wedge-like member, the vertical (height-wise) size of the Z stage becomes large.

BRIEF SUMMARY OF THE INVENTION

According to one aspect of the present invention, a stage mechanism includes a wedge that is with an inclined surface having a predetermined angle with respect to a horizontal direction, a roller that relatively rolls on the inclined surface of the wedge by relative horizontal movement of the wedge, a fine movement mechanism that supports the roller, goes up and down in accordance with up and down movement of the roller which relatively rolls on the inclined surfaces by the relative horizontal movement of the wedge, and can go up and down more finely than the up and down movement of the roller, a table that is supported by the fine movement mechanism, and an elastic body that is connected to the table, restrains horizontal movement of the table, and applies an elastic force, in at least one of upward and downward directions, to the table.

According to another aspect of the present invention, a stage mechanism includes a plurality of wedges each with an inclined surface having a predetermined angle with respect to a horizontal direction, a plurality of rollers each relatively rolling on the inclined surface of corresponding one of the plurality of wedges by relative horizontal movement of the plurality of wedge, a plurality of fine movement mechanisms that support the plurality of rollers one by one, go up and down in accordance with up and down movements of the plurality of rollers each relatively rolling on the inclined surface by the relative horizontal movement of the plurality of wedges, and can go up and down more finely than the up and down movements of the plurality of rollers, a table supported by the plurality of fine movement mechanisms, and a plurality of elastic bodies that are connected to the table, restrain horizontal movement of the table, and apply elastic force, in at least one of upward and downward directions, to the table.

According to yet another aspect of the present invention, a table height position adjustment method includes coarsely adjusting a height position of a table disposed above a roller, by up and down movement of the roller, resulting from a wedge moving horizontally and relative rolling of the roller on an inclined surface of the wedge having a predetermined inclined angle with respect to a horizontal direction, measuring displacement in a height direction between a predetermined position of the table and the inclined surface of the wedge, and finely adjusting the height position of the table by driving, according to a measured displacement, a fine movement mechanism which is disposed between the roller and the table and can move up and down more finely than the up and down movement of the roller.

DETAILED DESCRIPTION OF THE INVENTION

Embodiments below describe a stage mechanism that can highly accurately adjust the height position of a table while keeping (restraining) the size in the height direction small, and describe a method for adjusting the height.

First Embodiment

Figure 1:
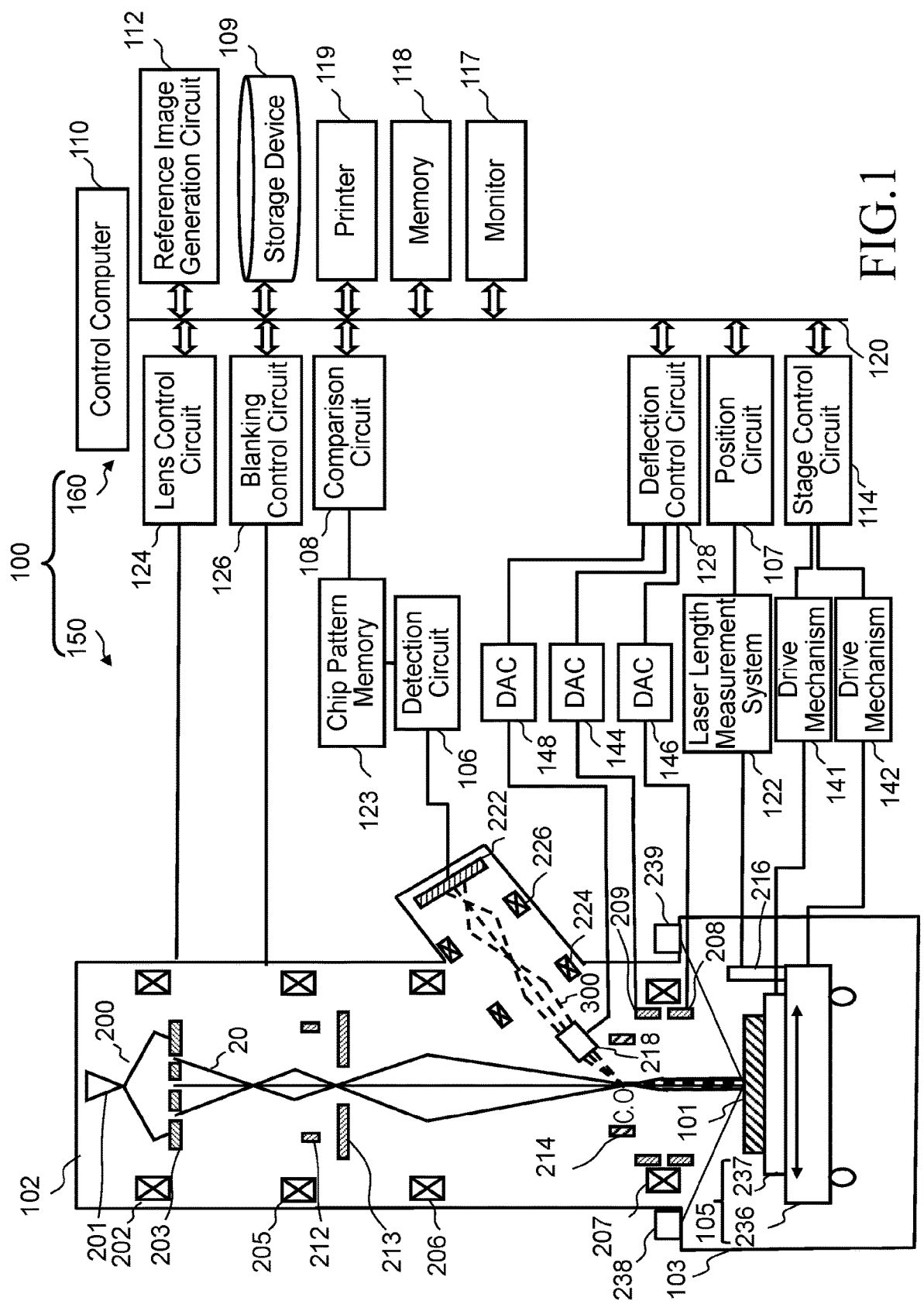
FIG. 1 shows an example of a configuration of a pattern inspection apparatus according to a first embodiment.

FIG. 1 shows an example of a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 (secondary electron image acquisition mechanism) and a control system circuit 160. The image acquisition mechanism 150 includes an electron beam column 102 (also called an electron optical column) and an inspection chamber 103. In the electron beam column 102, there are disposed an electron gun 201, an electromagnetic lens 202, a shaping aperture array substrate 203, an electromagnetic lens 205, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222. In the case of FIG. 1, a primary electron optical system that irradiates a substrate 101 with multiple primary electron beams 20 is composed of the electron gun 201, the electromagnetic lens 202, the shaping aperture array substrate 203, the electromagnetic lens 205, the common blanking deflector 212, the limiting aperture substrate 213, the electromagnetic lens 206, the electromagnetic lens 207 (objective lens), the main deflector 208, and the sub deflector 209. A secondary electron optical system that irradiates the multi-detector 222 with multiple secondary electron beams 300 is composed of the beam separator 214, the deflector 218, the electromagnetic lens 224, and the electromagnetic lens 226.

A stage 105 movable at least in the x, y, z, and θ directions is disposed in the inspection chamber 103. The stage 105 is composed of an XYθ stage 236 which is movable in the XYθ directions (the horizontal direction and the rotational direction) and a Z stage 237 (stage mechanism) which is on the XYθ stage 236 and movable in the Z direction (height direction). The substrate 101 (target object) to be inspected is mounted on the Z stage 237. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the Z stage 237, for example. Moreover, on the XYθ stage 236, there is disposed a mirror 216 which reflects a laser beam for measuring a laser length emitted from a laser length measuring system 122 arranged outside the inspection chamber 103. The multi-detector 222 is connected, at the outside of the electron beam column 102, to a detection circuit 106.

On the upper surface of the inspection chamber 103, a Z sensor including a projector 238 and a photoreceiver 239 for measuring the height position of the substrate 101 is disposed.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The detection circuit 106 is connected to the chip pattern memory 123 which is connected to the comparison circuit 108. The stage 105 is driven by drive mechanisms 141 and 142 under the control of the stage control circuit 114. In the drive mechanism 142, a drive system such as a three (x-, y-, and θ-) axis motor which provides drive in the directions of x, y, and θ in the stage coordinate system is configured. The XYθ stage 236 can move in the x, y, and θ directions. A step motor, for example, can be used as each of these x, y, and θ motors (not shown). The XYθ stage 236 is movable in the horizontal direction and the rotation direction by the x-, y-, and θ-axis motors. The movement position of the XYθ stage 236 is measured by the laser length measuring system 122, and supplied (transmitted) to the position circuit 107. Based on the principle of laser interferometry, the laser length measuring system 122 measures the position of the XYθ stage 236 by receiving a reflected light from the mirror 216. In the stage coordinate system, the x, y, and θ directions are set with respect to a plane perpendicular to the optical axis (center axis of electron trajectory) of the multiple primary electron beams 20, for example. The drive mechanism 141 moves the Z stage 237 in the z direction. As will be described later, a single-axis drive system, such as a stepping motor actuator with encoder, which moves in the x direction in the stage coordinate system is configured, for example, and the Z stage 237 can be moved in the z direction by conversion of the movement in the x direction to that in the z direction.

The electromagnetic lenses 202, 205, 206, 207 (objective lens), 224 and 226, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 146.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, applying a voltage to another extraction electrode (Wehnelt) and heating the cathode to a predetermined temperature are performed, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
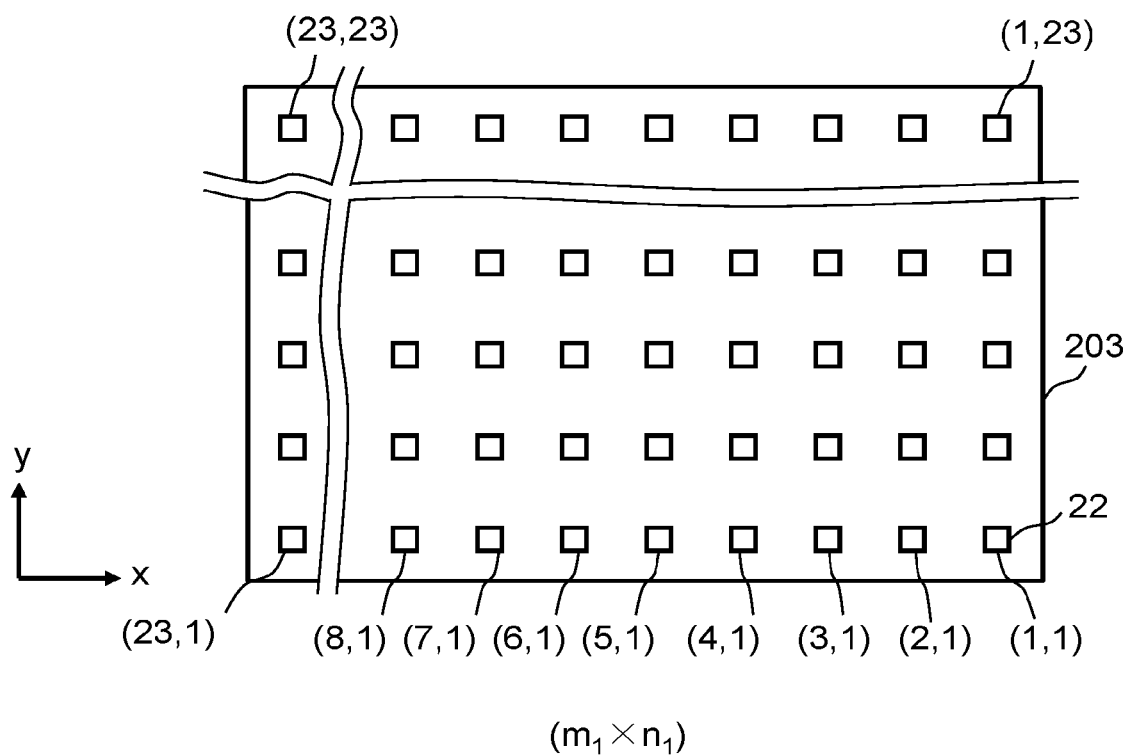
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ rows long (length in the y direction) (each row in the x direction) and $n_1$ columns wide (width in the x direction) (each column in the y direction) are two-dimensionally formed at a predetermined arrangement pitch in the shaping aperture array substrate 203, where one of $m_1$ and $n_1$ is an integer of 2 or more, and the other is an integer of 1 or more. In the case of FIG. 2, 23×23 holes (openings) 22 are formed. Ideally, each of the holes 22 is a rectangle (including a square) having the same dimension, shape, and size. Alternatively, ideally, each of the holes 22 may be a circle with the same outer diameter. $m_1 \times n_1$ (=N) multiple primary electron beams 20 are formed by letting portions of the electron beam 200 individually pass through a corresponding one of a plurality of holes 22.

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200, which irradiate the positions of a plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens) while repeating forming an intermediate image and a crossover through the beam separator 214 disposed at the crossover position of each beam of the multiple primary electron beams 20. Then, the electromagnetic lens 207 focuses the multiple primary electron beams 20 onto the substrate 101. The multiple primary electron beams 20 having been focused on the substrate 101 (target object) by the electromagnetic lens 207 (objective lens) are collectively deflected by the main deflector 208 and the sub deflector 209 to irradiate respective beam irradiation positions on the substrate 101. When all of the multiple primary electron beams 20 are collectively deflected by the common blanking deflector 212, they deviate from the hole in the center of the limiting aperture substrate 213 and blocked by the limiting aperture substrate 213. On the other hand, the multiple primary electron beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

The beam separator 214 generates an electric field and a magnetic field to be perpendicular to each other in a plane perpendicular to the traveling direction of the center beam of the multiple primary electron beams 20 (that is, electron trajectory central axis). The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 having been bent obliquely upward and separated from the multiple primary electron beams 20 are further bent by the deflector 218, and projected, while being refracted, onto the multi-detector 222 by the electromagnetic lenses 224 and 226. The multi-detector 222 detects the projected multiple secondary electron beams 300. It is acceptable that reflected electrons and secondary electrons are projected on the multi-detector 222, or that reflected electrons are emitted on the way and remaining secondary electrons are projected. The multi-detector 222 includes a two-dimensional sensor (to be described later). Each secondary electron of the multiple secondary electron beams 300 collides with a corresponding region of the two-dimensional sensor, generates an electron, and generates secondary electron image data for each pixel. In other words, in the multi-detector 222, a detection sensor is disposed for each primary electron beam_i of the multiple primary electron beams 20, where i=1 to 529 in the case of the multiple primary electron beams 20 being composed of 23×23 beams. Then, the detection sensor detects a corresponding secondary electron beam emitted by irradiation with the primary electron beam i. Therefore, each of a plurality of detection sensors in the multi-detector 222 detects an intensity signal of a secondary electron beam for an image, which is resulting from irradiation with a corresponding primary electron beam 10. The intensity signal detected by the multi-detector 222 is output to the detection circuit 106.

Figure 3:
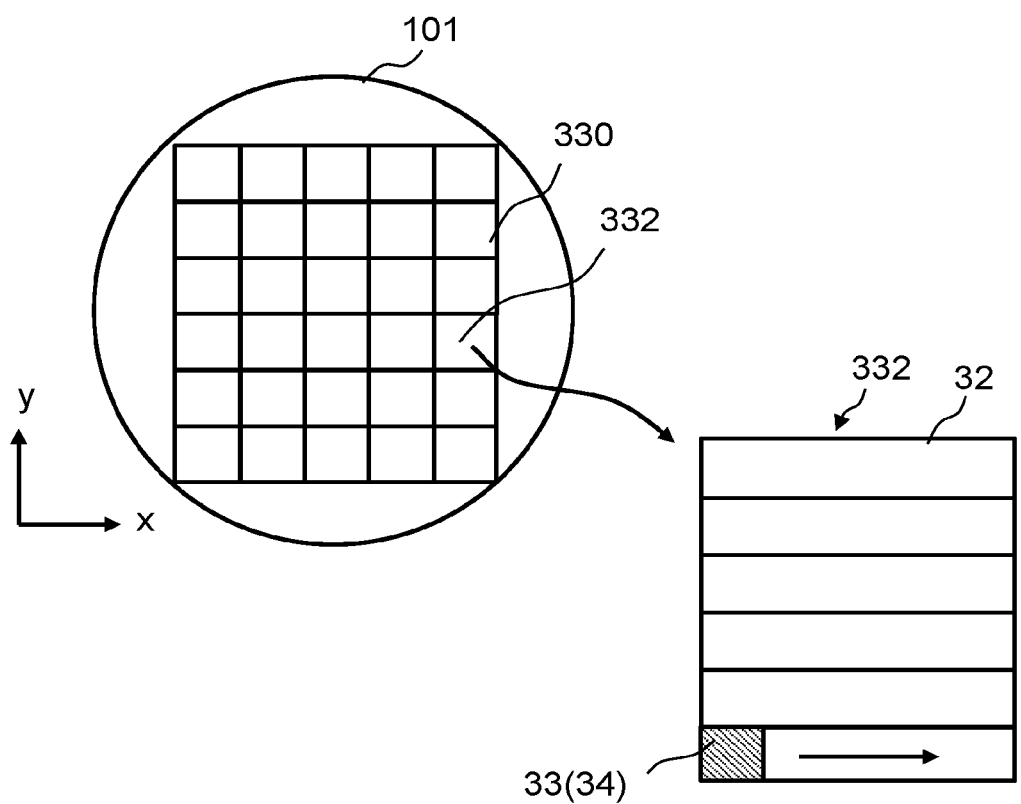
FIG. 3 shows an example of a plurality of chip regions formed on a semiconductor substrate, according to the first embodiment.

FIG. 3 shows an example of a plurality of chip regions formed on a semiconductor substrate, according to the first embodiment. In FIG. 3, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate is reduced to ¼, for example, and exposed/transferred onto each chip 332 by an exposure device (stepper) (not shown). The region of each chip 332 is divided into a plurality of stripe regions 32 by a predetermined width being in the y direction, for example. The scanning operation by the image acquisition mechanism 150 is carried out for each stripe region 32, for example. A scanning operation for the stripe region 32 advances relatively in the x direction while the stage 105 is moved in the −x direction, for example. Each stripe region 32 is divided into a plurality of frame regions 33 in the longitudinal direction. Beam application to the frame region 33 concerned is achieved by collectively deflecting all the multiple beams 20 by the main deflector 208.

Figure 4:
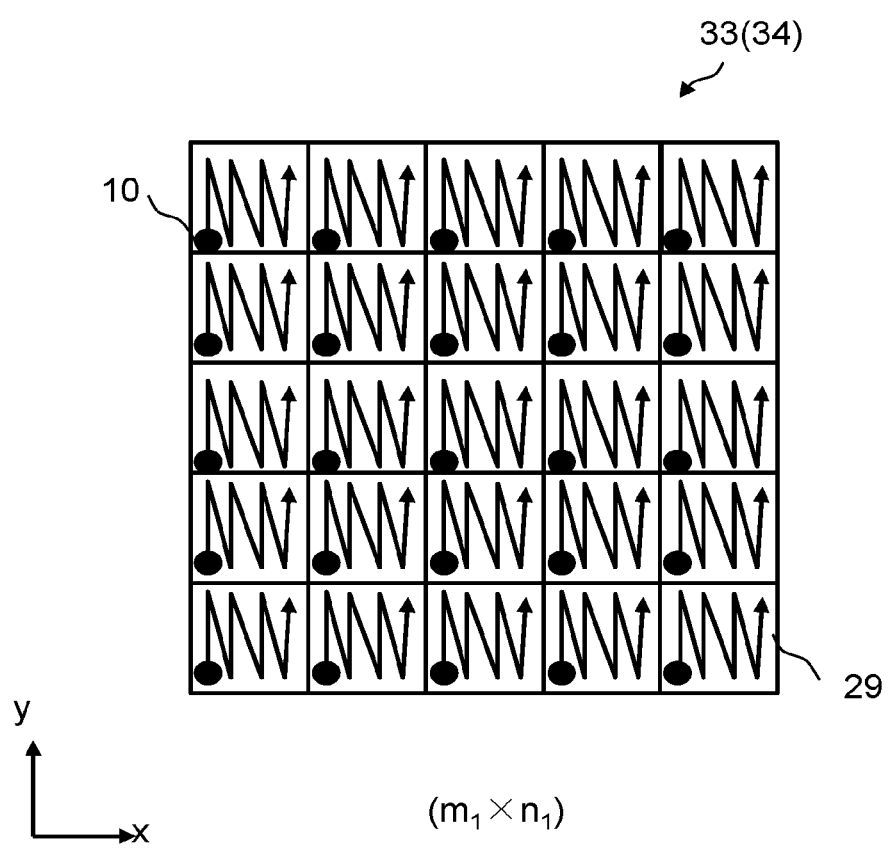
FIG. 4 illustrates a scanning operation with multiple beams according to the first embodiment.

FIG. 4 illustrates a scanning operation with multiple beams according to the first embodiment. FIG. 4 shows the case of multiple primary electron beams 20 of 5 rows×5 columns (5 rows by κ columns). The size of an irradiation region 34 that can be irradiated by one irradiation with the multiple primary electron beams 20 is defined by (x direction size obtained by multiplying a pitch between beams in the x direction of the multiple primary electron beams 20 on the substrate 101 by the number of beams in the x direction)×(y direction size obtained by multiplying a pitch between beams in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the case of FIGS. 3 and 4, the irradiation region 34 and the frame region 33 are of the same size. However, it is not limited thereto. The irradiation region 34 may be smaller than the frame region 33, or larger than it. Each beam of the multiple primary electron beams 20 scans a sub-irradiation region 29 concerned surrounded by the pitch between the beams in the x direction and the pitch between the beams in the y direction such that the beam concerned itself is located therein. Each primary electron beam 10 of the multiple primary electron beams 20 is associated with any one of the sub-irradiation regions 29 which are different from each other. At the time of each shot, each primary electron beam 10 is applied to the same position in the associated sub-irradiation region 29. The primary electron beam 10 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 10. When scanning one sub-irradiation region 29 is completed, the irradiation position is moved to an adjacent frame region 33 in the same stripe region 32 by collectively deflecting all the multiple primary electron beams 20 by the main deflector 208. By repeating this operation, the inside of the stripe region 32 is irradiated in order. After scanning one stripe region 32 is completed, the irradiation position is moved to the next stripe region 32 by moving the stage 105 and/or by collectively deflecting all the multiple primary electron beams 20 by the main deflector 208. As described above, a secondary electron image of each sub-irradiation region 29 is acquired by irradiation with each primary electron beam 10. By combining the secondary electron image of each sub-irradiation region 29, a secondary electron image of the frame region 33, a secondary electron image of the stripe region 32, or a secondary electron image of the chip 332 is configured.

It is also preferable to group, for example, a plurality of chips 332 arranged in the x direction as one group, and to divide each group into a plurality of stripe regions 32 by a predetermined width in the y direction, for example. Then, moving between the stripe regions may be performed not only for each chip 332 but also for each group.

In the case of the substrate 101 being irradiated with the multiple primary electron beams 20 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, in the case of scanning the sub-irradiation region 29, the emission position of each secondary electron beam changes every second inside the sub-irradiation region 29. Thus, the deflector 218 collectively deflects the multiple secondary electron beams 300 so that each secondary electron beam whose emission position has changed may be applied to a corresponding detection region of the multi-detector 222.

For improving the inspection accuracy, it is necessary to increase accuracy of focusing (focus adjustment) of the multiple primary electron beams 20 (electron beam). Then, for increasing the accuracy of focusing, it is necessary to highly accurately adjust and control the height position of the Z stage 237 to mount the substrate 101 thereon. Therefore, in the first embodiment, a coarse movement mechanism for the height position and a fine movement mechanism for the height position are disposed in the Z stage 237 in order to perform coarse adjustment by the coarse movement mechanism and fine adjustment by the fine movement mechanism.

Figure 5A:
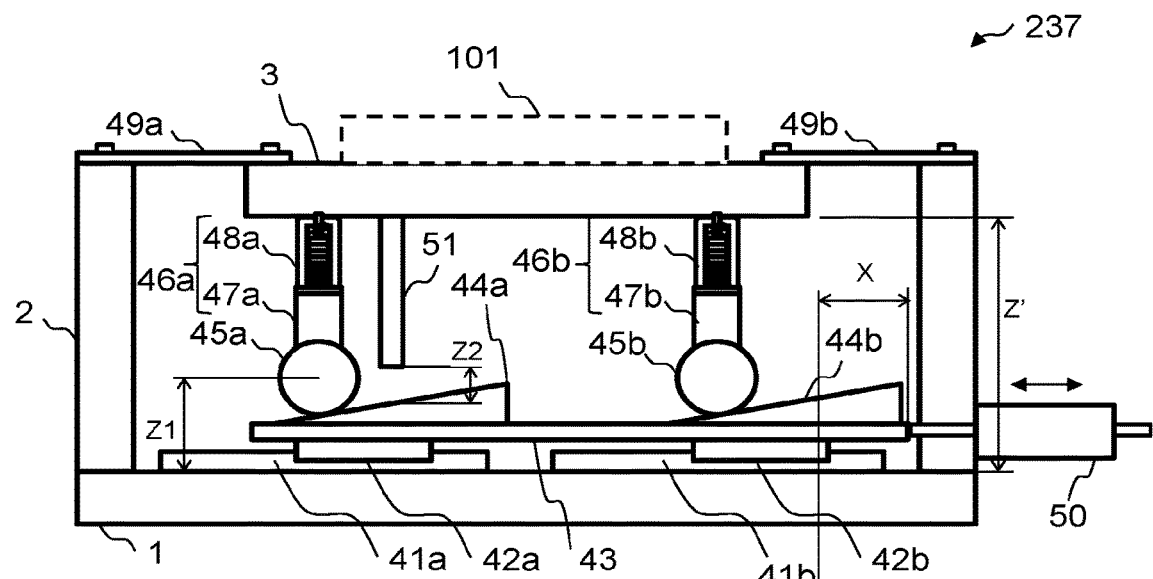
FIGS. 5A and 5B show examples of configuration of a Z stage according to the first embodiment.
Figure 5B:
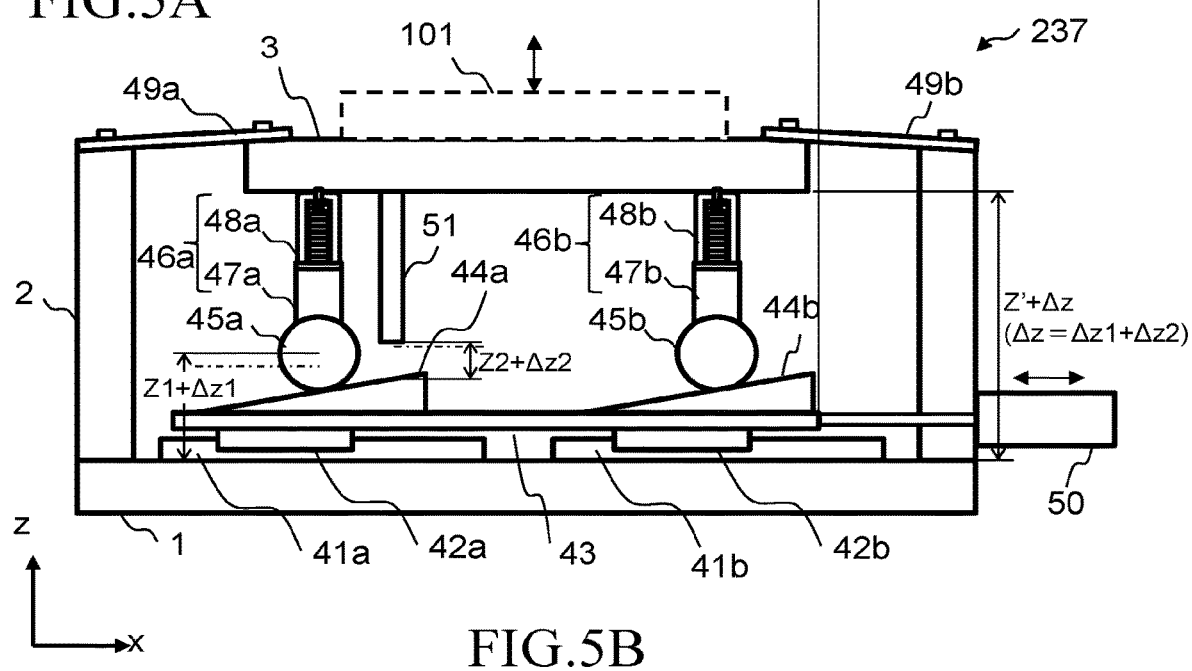

FIGS. 5A and 5B show examples of the configuration of a Z stage according to the first embodiment.

Figure 6:
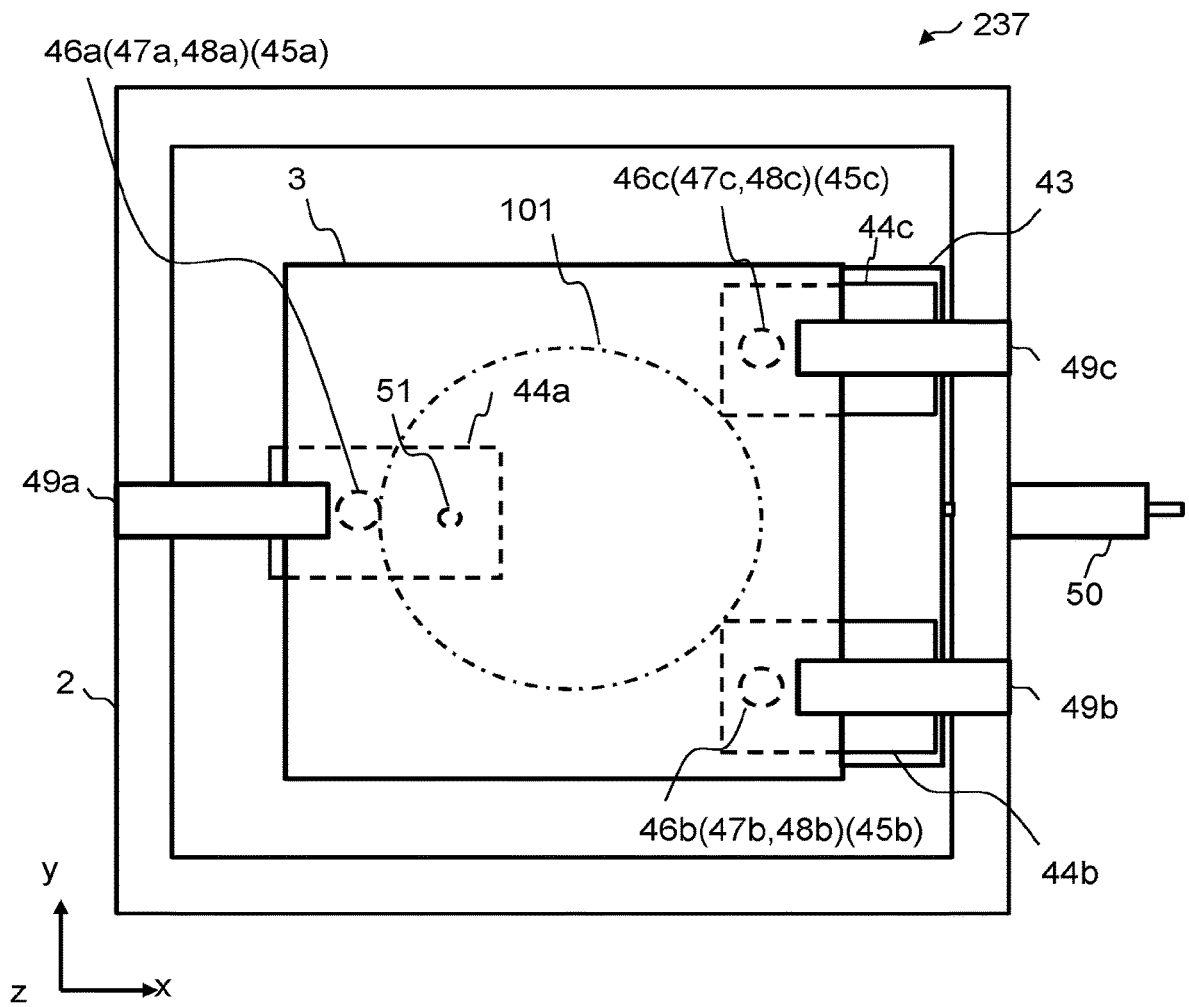
FIG. 6 shows an example of a top view of a Z stage according to the first embodiment.

FIG. 6 shows an example of the top view of a Z stage according to the first embodiment.

The Z stage 237 (example of stage mechanism) shown in the examples of FIGS. 5A and 6 includes a plurality of rails 41a, 41b, and 41c (which is not shown) on a base 1. FIG. 5A shows two of mechanisms each supporting a table 3 at three points. As an example, two rails 41a and 41b in three rails 41a, 41b, and 41c are shown. A slider 42a, travelling on a rail 41a, is disposed on the rail 41a. A slider 42b, travelling on a rail 41b, is disposed on the rail 41b. A slider 42c (not shown), travelling on a rail 41c (not shown), is disposed on the rail 41c. A plate 43 extends over the slider 42a, the slider 42b, and the slider 42c, and is supported on them. A wedge (shim) 44a is disposed on the slider 42a through the plate 43. A wedge 44b is disposed on the slider 42b through the plate 43. A wedge 44c (not shown) is disposed on the slider 42c through the plate 43. Each of a plurality of wedges 44a, 44b, and 44c forms an inclined surface having a predetermined angle with respect to the horizontal direction. In the case of FIG. 5A, the inclined surfaces have the same angle. It is preferable that the plurality of wedges 44a, 44b, and 44c have completely the same shape. In the examples of FIGS. 5A and 6, the lower surfaces of the plurality of wedges 44a, 44b, and 44c are formed horizontally. The vertical sections of the plurality of wedges 44a, 44b, and 44c are right-angled triangles. However, it is not limited thereto. The lower surfaces of the plurality of wedges 44a, 44b, and 44c may also have a predetermined angle with respect to the horizontal direction. By horizontally pushing or pulling the plate 43 by driving an actuator 50, the slider 42a, the slider 42b, and the slider 42c can travel together on the rails 41a, 41b, and 41c. By travelling with the slider 42a, the slider 42b, and the slider 42c, the plurality of wedges 44a, 44b, and 44c are movable in the horizontal direction. Here, they are movable in the horizontal straight direction.

In FIGS. 5A and 6, by the horizontal movement of the plurality of wedges 44a, 44b, and 44c, each of a plurality of rollers 45a, 45b, and 45c (which is not shown) relatively rolls on a corresponding inclined surface of the plurality of wedges 44a, 44b, and 44c. Specifically, by the horizontal movement of the wedge 44a, the roller 45a relatively rolls on the inclined surface of the wedge 44a. By the horizontal movement of the wedge 44b, the roller 45b relatively rolls on the inclined surface of the wedge 44b. By the horizontal movement of the wedge 44c, the roller 45c relatively rolls on the inclined surface of the wedge 44c. Thus, for example, the coarse movement mechanism for the height position is configured by a plurality of wedges 44a, 44b, and 44c which are movable horizontally, and a plurality of rollers 45a, 45b, and 45c which roll on the inclined surfaces.

Moreover, in FIG. 5A, there are disposed a plurality of fine movement mechanisms 46a, 46b, and 46c (which is not shown) each downwardly supporting a corresponding one of a plurality of rollers 45a, 45b, and 45c. The plurality of fine movement mechanisms 46a, 46b, and 46c go up and down in accordance with up and down movement (coarse movement) of the plurality of rollers 45a, 45b, and 45c which relatively roll on the inclined surfaces by the horizontal movement of the plurality of wedges 44a, 44b, and 44c. Specifically, the fine movement mechanism 46a goes up and down in accordance with the up and down movement of the roller 45a which relatively rolls on the inclined surface by horizontal movement of the wedge 44a. The fine movement mechanism 46b goes up and down in accordance with the up and down movement of the roller 45b which relatively rolls on the inclined surface by horizontal movement of the wedge 44b. The fine movement mechanism 46c goes up and down in accordance with the up and down movement of the roller 45c which relatively rolls on the inclined surface by horizontal movement of the wedge 44c. The plurality of fine movement mechanisms 46a, 46b, and 46c include a plurality of axes 47a, 47b, and 47c each downwardly supporting a corresponding one of the plurality of rollers 45a, 45b, and 45c, and a plurality of piezoelectric elements 48a, 48b, and 48c each arranged on a corresponding one of the plurality of axes 47a, 47b, and 47c. Specifically, in the fine movement mechanism 46a, the axis 47a downwardly supports the roller 45a, and the piezoelectric element 48a is arranged on the axis 47a. Similarly, in the fine movement mechanism 46b, the axis 47b downwardly supports the roller 45b, and the piezoelectric element 48b is arranged on the axis 47b. In the fine movement mechanism 46c, the axis 47c downwardly supports the roller 45c, and the piezoelectric element 48c is arranged on the axis 47c. Compared with the up and down movement (coarse movement) of a plurality of rollers 45a, 45b, and 45c, a plurality of fine movement mechanisms 46a, 46b, and 46c can more finely go up and down (perform up and down movement finely) by using the piezoelectric elements 48a, 48b, and 48c. Specifically, in the fine movement mechanism 46a, the piezoelectric element 48a performs up and down movement finely. In the fine movement mechanism 46b, the piezoelectric element 48b performs up and down movement finely. In the fine movement mechanism 46c, the piezoelectric element 48c performs up and down movement finely.

Moreover, in FIG. 5A, the table 3, on which the substrate 101 to be inspected is placed, is supported by a plurality of fine movement mechanisms 46a, 46b, and 46c. Each fine movement mechanism 46 supports the roller 45 from the upper side of the roller 45, and the table 3 from the lower side of the table 3. Specifically, the table 3 is supported by a plurality of legs each composed of a set of the roller 45a, the axis 47a, and the piezoelectric element 48a, a set of the roller 45b, the axis 47b, and the piezoelectric element 48b, and a set of the roller 45c, the axis 47c, and the piezoelectric element 48c. Since the table 3 is directly supported by a plurality of these legs, it is unnecessary to prepare an intermediate table, etc. Therefore, the thickness of the table 3 is the thickness of the Z table 237, and it is possible to keep (restrain) the size in the height direction small from the lower surface of the base to the top surface of the table 3. Preferably, the lengths of a plurality of these legs are formed to be the same as each other. Each of the rollers 45a, 45b, and 45c is disposed on the corresponding inclined surface of the wedges 44a, 44b, and 44c at the position where the table 3 is horizontally maintained when supported by a plurality of these legs. In the case of FIG. 5A, the rotation center of each of the rollers 45a, 45b, and 45c and the top surface of the base 1 are adjusted according to the distance Z1 in the vertical direction.

A frame 2 is arranged such that the distance (length) between the both sides of the frame 2 is wider than the width of the table 3. In other words, the frame 2 of the size where the table 3 can be arranged thereinside is disposed on the base 1. The frame 2 is disposed to surround the table 3. It is preferable that the height position of the frame 2 is the same or approximately the same as that of the top surface of the table 3. It is also preferable that a plurality of supporting posts, instead of the frame 2, are disposed on the base 1 such that they surround the table 3. A plurality of leaf springs 49a, 49b, and 49c (elastic body) are connected to the top surface of the frame 2 and the top surface of the table 3. The plurality of leaf springs 49a, 49b, and 49c restrain horizontal movement of the table 3, and apply an elastic force, in at least one of upward and downward directions, to the table 3. It is also preferable to use elastic hinges as the elastic body, instead of the leaf springs 49a, 49b, and 49c. In the examples of FIGS. 5A and 6, the leaf spring 49a is fixed, for example, with a screw, etc., to the left end of the top surface of the table 3, and the left end of the top surface of the frame 2. The leaf spring 49b is fixed, for example, with a screw, etc., to the right end of the top surface of the table 3, and the right end of the top surface of the frame 2. The leaf spring 49c is fixed, for example, with a screw, etc., to the right end of the top surface of the table 3, and the right end of the top surface of the frame 2. By directly fixing a plurality of leaf springs 49a, 49b, and 49c to both the right and left sides of the table 3, it is possible to suppress wavering in the horizontal direction of the table 3. Therefore, the posture/position of the table 3 can be controlled. For example, if a plurality of leaf springs 49a, 49b, and 49c is arranged in the same direction as the direction of expansion and contraction of the actuator 50, it can be preferable because the effect of suppressing wavering in the horizontal direction of the table 3 becomes large. Although, in FIGS. 5A and 6, the leaf springs 49a, 49b, and 49c are arranged to right and left, they may be arranged at the front side and back side, or at the four ends corresponding to the four sides of the top surface of the table 3. Alternatively, it is also preferable that they are arranged at the positions shifted by 120 degrees when viewed from the upper side.

Moreover, in FIGS. 5A and 6, a displacement sensor 51 is disposed on the backside of the table 3. The displacement sensor 51 measures displacement in the height direction between a predetermined position of the table 3 and an inclined surface of one of a plurality of wedges 44a, 44b, and 44c. For example, the displacement sensor 51 measures the distance Z2 to the inclined surface of the wedge 44a by vertically applying a laser, and measures displacement $\Delta z2$.

In the examples of FIGS. 5A and 6, a plurality of wedges 44a, 44b, and 44c (which is not shown) are disposed facing in the same direction, and horizontally moved together by the actuator 50 (drive mechanism). FIG. 5B shows the state where a plurality of wedges 44a, 44b, and 44c have been moved in the −x direction (leftward in the figure) by the distance X compared with FIG. 5A, for example. FIG. 5A shows the state where the table 3 has been moved in the z direction (upward in the figure) by the displacement $\Delta z2$ by extending a plurality of fine movement mechanisms 46a and 46b. Displacement $\Delta z1$ indicating that a plurality of rollers 45a, 45b and 45c (which is not shown) move rollingly in the height direction on the inclined surfaces of a plurality of wedges 44a, 44b, and 44c can be obtained by the following equation (1) using a movement distance (length) X in the x direction of a plurality of wedges 44a, 44b, and 44c, and an angle θ of the inclined surface of each of (the plurality of wedges 44a, 44b, and 44c with respect to the horizontal direction.

$$\Delta z1 = X \cdot \tan \theta \qquad (1)$$

Since each of a plurality of wedges 44a, 44b, and 44c has the inclined surface of the same angle, the heights of a plurality of rollers 45a, 45b, and 45c, and a plurality of fine movement mechanisms 46a, 46b, and 46c connected to the plurality of rollers 45a, 45b, and 45c go up by the displacement $\Delta z1$ by movement in the x direction of the plurality of wedges 44a, 44b, and 44c, and similarly, the height of the table 3 also goes up by the displacement $\Delta z1$ as shown in FIG. 5B. Moreover, the height position of the point on the inclined surface which the displacement sensor 51 measures similarly goes up by the displacement $\Delta z1$ by the movement in the x direction of the plurality of wedges 44a, 44b, and 44c. Therefore, the state can be made where there is no change (difference) between measured distances of the displacement sensor 51 in FIGS. 5A and 5B. Furthermore, the height of the table 3 goes up in the z direction (upward in the figure) by the displacement $\Delta z2$ by extension of a plurality of fine movement mechanisms 46a, 46b, and 46c by the displacement $\Delta z2$. Accordingly, the distance from the upper surface of the base 1 to the lower surface of the table 3 extends by $\Delta z$, from Z' in FIG. 5A to Z'+$\Delta z$ ($\Delta z=\Delta z1+\Delta z2$) in FIG. 5B. Therefore, as shown in FIG. 5B, the displacement sensor 51 can measure only the displacement $\Delta z2$ in the height direction of the table 3 moved by a plurality of fine movement mechanisms 46a, 46b, and 46c, by excluding the displacement $\Delta z1$ in the height direction of the table 3 moved by a plurality of coarse movement mechanisms from $\Delta z$ ($\Delta z=\Delta z1+\Delta z2$). Thus, the displacement $\Delta z$ in the height direction of the table 3 is the sum of the displacement $\Delta z1$ by the coarse movement mechanism and the displacement $\Delta z2$ by the fine movement mechanisms 46a, 46b, and 46c.

Figure 7:
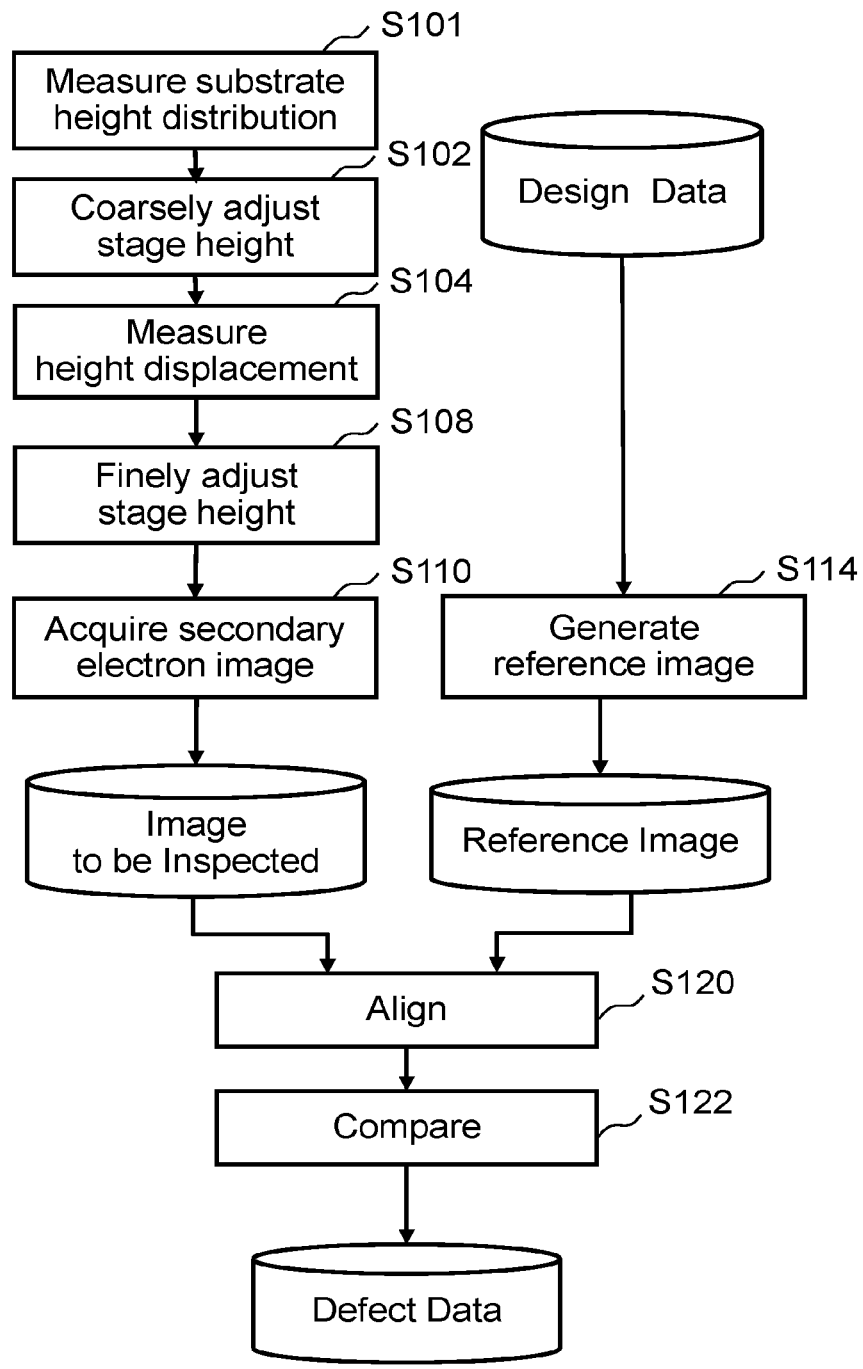
FIG. 7 is a flowchart showing main steps of an inspection method according to the first embodiment.

FIG. 7 is a flowchart showing main steps of an inspection method according to the first embodiment. In FIG. 7, the inspection method of the first embodiment executes a series of steps: a substrate height distribution measurement step (S101), a stage height coarse adjustment step (S102), a height displacement measurement step (S104), a stage height fine adjustment step (S108), a secondary electron image acquisition step (S110), a reference image generation step (S114), an alignment step (S120), and a comparison step (S122). The method for adjusting the table height position according to the first embodiment carries out the stage height coarse adjustment step (S102), the height displacement measurement step (S104), and the stage height fine adjustment step (S108) in the steps shown in FIG. 7.

In the substrate height distribution measurement step (S101), the height position of the substrate 101 is measured by irradiating the substrate 101 with a light emitted from the projector 238 of the Z sensor, and receiving a reflected light with the photoreceiver 239. While moving the stage 105, the height position of each position on the substrate 101 is measured to acquire a height position distribution of the substrate 101. Data of the acquired height position distribution is stored in the storage device 109.

In the stage height coarse adjustment step (S102), in the Z stage 237, coarse adjustment of the height position of the table 3 arranged above the rollers 45a, 45b, and 45c is performed by up and down movement of the rollers 45a, 45b, and 45c caused by relative rolling of the rollers 45a, 45b, and 45c on the inclined surfaces of the wedges 44a, 44b, and 44c each having a predetermined inclined angle θ with respect to the horizontal direction when the wedges 44a, 44b, and 44c are horizontally moved.

Figure 8:
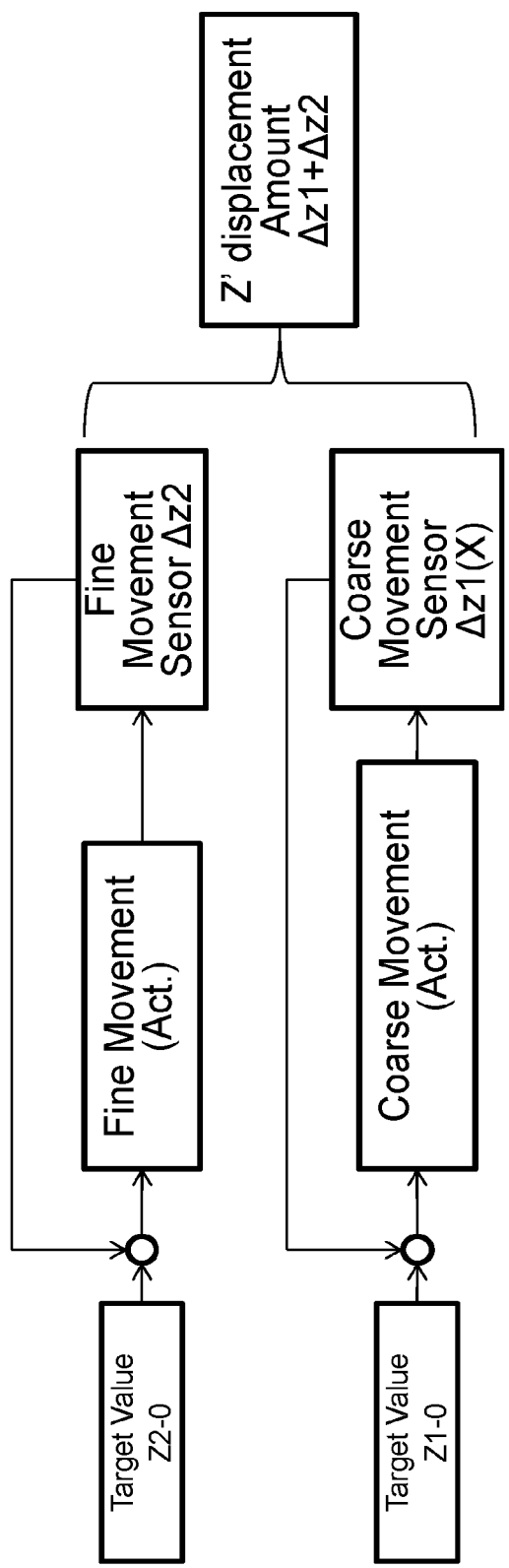
FIG. 8 shows a method for adjusting a table height according to the first embodiment.

FIG. 8 shows a method for adjusting a table height according to the first embodiment. The stage control circuit 114 reads height position distribution data stored in the storage device 109, and sets a coarse adjustment target value Z1-0. Under the control of the stage control circuit 114, the actuator 50 horizontally moves the wedges 44a, 44b, and 44c, based on the coarse adjustment target value Z1-0. An encoder mounted in the actuator 50 measures a movement distance X in the x direction. An x-direction target value X1-0 can be obtained by dividing the coarse adjustment target value Z1-0 by tan θ. In the first embodiment, the encoder functions as a coarse movement sensor. As the coarse adjustment, the table 3 is moved by Δz1 in the height direction by moving the wedges 44a, 44b, and 44c by the target value X1-0 in the x direction, based on a measurement result of the encoder.

In the height displacement measurement step (S104), the displacement sensor 51 measures displacement Δz2 in the height direction between a predetermined position of the table 3 and the inclined surface of the wedge 44a. The measurement result is output to the stage control circuit 114.

In the stage height fine adjustment step (S108), the height position of the table 3 is finely adjusted by driving, according to the measured displacement Δz2, the fine movement mechanisms 46a, 46b, and 46c which can move up and down more finely than the up and down movement of the rollers 45a, 45b, and 45c. Each fine movement mechanism 46 finely adjusts the height position of the table 3 while moving up and down with the up and down movement of each roller 45. The stage control circuit 114 reads height position distribution data stored in the storage device 109, and sets a fine adjustment target value Z2-0 as shown in FIG. 8. Under the control of the stage control circuit 114, the piezoelectric elements 48a, 48b, and 48c are driven based on the target value Z2-0, and the table 3 is moved by Δz2 in the height direction as a fine adjustment while feeding back a measurement result of the displacement sensor 51. According to the first embodiment, since the horizontal movement of the table 3 is directly restrained by a plurality of leaf springs 49a, 49b, and 49c, it is possible to suppress posture/position displacement (tilt displacement) of the table 3 due to rolling of the rollers 45a, 45b, and 45c, and driving of the piezoelectric elements 48a, 48b, and 48c.

Figure 9:
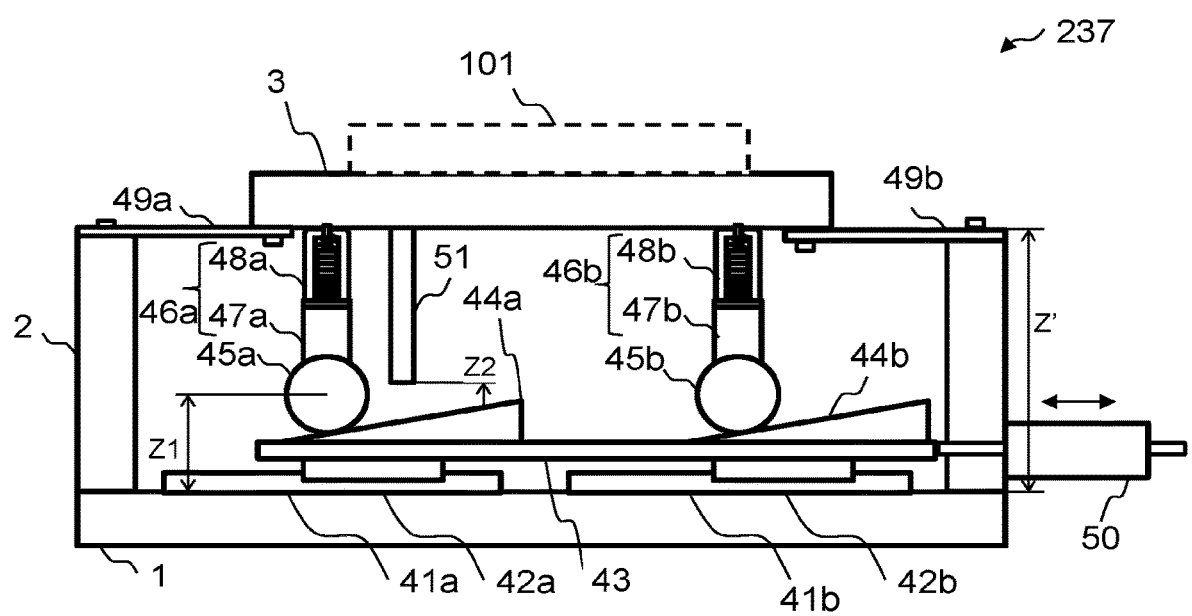
FIG. 9 shows another example of a configuration of a Z stage according to the first embodiment.

FIG. 9 shows another example of a configuration of a Z stage according to the first embodiment. FIG. 9 shows the case where a plurality of leaf springs 49a, 49b, and 49c (which is not shown) are connected to the back side of the table 3. Other respects are the same as those of FIG. 5A. Thus, as shown in FIG. 9, it is also preferable that the arrangement position of the plurality of leaf springs 49a, 49b, and 49c is on the lower surface of the table 3.

Figure 10:
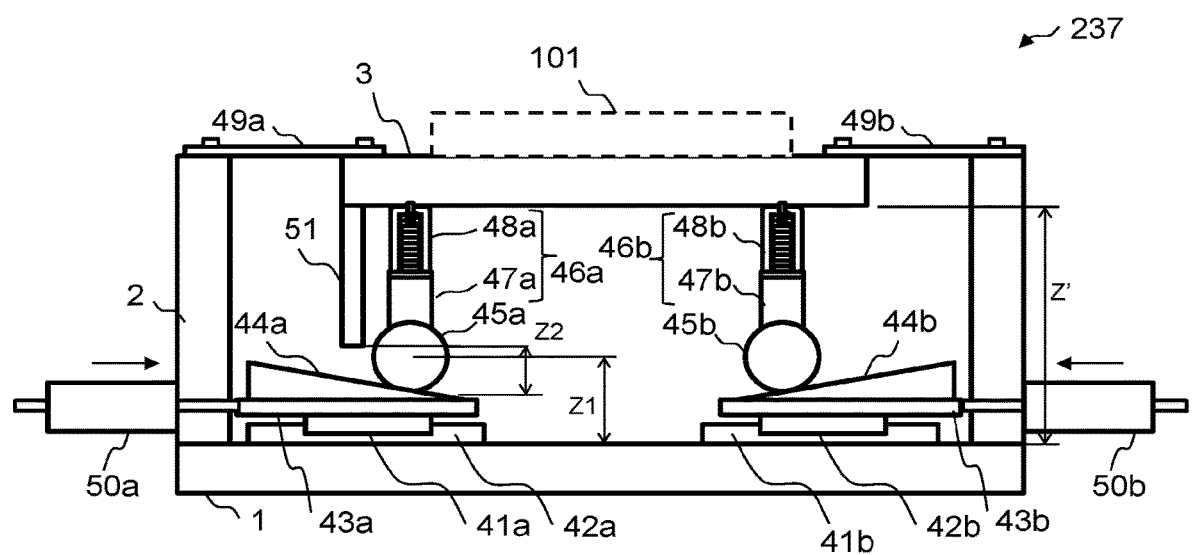
FIG. 10 shows another example of a configuration of a Z stage according to the first embodiment.

FIG. 10 shows another example of a configuration of a Z stage according to the first embodiment. FIG. 10 shows the case where the orientations (facing directions) of arrangement of a plurality of wedges 44a, 44b, and 44c are different from each other. FIG. 10 is the same as FIG. 5A except that the orientations of a plurality of wedges 44a, 44b, and 44c are different from each other, that a plurality of plates 43a, 43b, and 43c (which is not shown) are individually arranged for a corresponding one of the plurality of wedges, and that a plurality of actuators 50a, 50b, and 50c (which is not shown) are individually arranged for moving a corresponding one of the plurality of wedges. When the orientations of a plurality of wedges 44a, 44b, and 44c are different from each other, the actuators 50a, 50b, and 50c should be individually arranged for a corresponding one of the wedges 44a, 44b, and 44c.

As described above, according to the first embodiment, since the table 3 is directly supported by a plurality of legs each composed of a set of the roller 45a, the axis 47a, and the piezoelectric element 48a, a set of the roller 45b, the axis 47b, and the piezoelectric element 48b, and a set of the roller 45c, the axis 47c, and the piezoelectric element 48c, it is unnecessary to prepare an intermediate table, etc. Therefore, the thickness of the Z table 237 can be made thin. Furthermore, by holding the table 3 by a plurality of leaf springs 49, rigidity in the horizontal direction can be secured compared with the case of supporting the table 3 only by a piezo actuator.

As described above, according to the first embodiment, the height position of the table can be highly accurately adjusted by coarse adjustment and fine adjustment while keeping (restraining) the size in the height direction small.

In the secondary electron image acquisition step (S110), the image acquisition mechanism 150 (secondary electron image acquisition mechanism) irradiates the substrate 101, on which a plurality of figure patterns are formed and which is disposed on the stage 105 whose height position has been adjusted, with the multiple primary electron beams 20 to acquire a secondary electron image by detecting the multiple secondary electron beams 300 emitted from the substrate 101 by irradiation with the multiple primary electron beams 20. As described above, reflected electrons and secondary electrons may be projected on the multi-detector 222, or alternatively, after reflected electrons having been emitted along the way, only remaining secondary electrons may be projected thereon.

For acquiring an image, as described above, the multiple primary electron beams 20 are applied to the substrate 101 so that the multi-detector 222 may detect the multiple secondary electron beams 300 emitted from the substrate 101 by the irradiation with the multiple primary electron beams 20. Detected data (measured image data: secondary electron image data: inspection image data) on a secondary electron of each pixel in each sub irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, the acquired measured image data is transmitted to the comparison circuit 108, together with information on each position from the position circuit 107.

In the reference image generation step (S114), the reference image generation circuit 112 generates a reference image corresponding to a mask die image, based on design data serving as a basis of a plurality of figure patterns formed on the substrate 101. Specifically, it operates as follows: First, design pattern data is read from the storage device 109 through the control computer 110, and each figure pattern defined in the read design pattern data is converted into image data of binary or multiple values.

Here, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as the figure data is input to the reference image generation circuit 112, the data is developed into data of each figure. Then, the figure code, the figure dimensions, and the like indicating the figure shape of each figure data are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates occupancy occupied by a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $\frac{1}{2}^8$ (=$\frac{1}{256}$), the occupancy in each pixel is calculated by allocating small regions which correspond to the region of figures arranged in the pixel concerned and each of which corresponds to $\frac{1}{256}$ resolution. Then, the occupancy is generated as 8-bit occupancy data. The square region (inspection pixel) can be in accordance with the pixel of measured data.

Next, the reference image generation circuit 112 performs filtering processing on design image data of a design pattern which is image data of a figure, using a predetermined filter function. Thereby, it is possible to match/fit the design image data being image data on the design side, whose image intensity (gray scale level) is represented by digital values, with image generation characteristics obtained by irradiation with the multiple primary electron beams 20. The generated image data for each pixel of a reference image is output to the comparison circuit 108.

Figure 11:
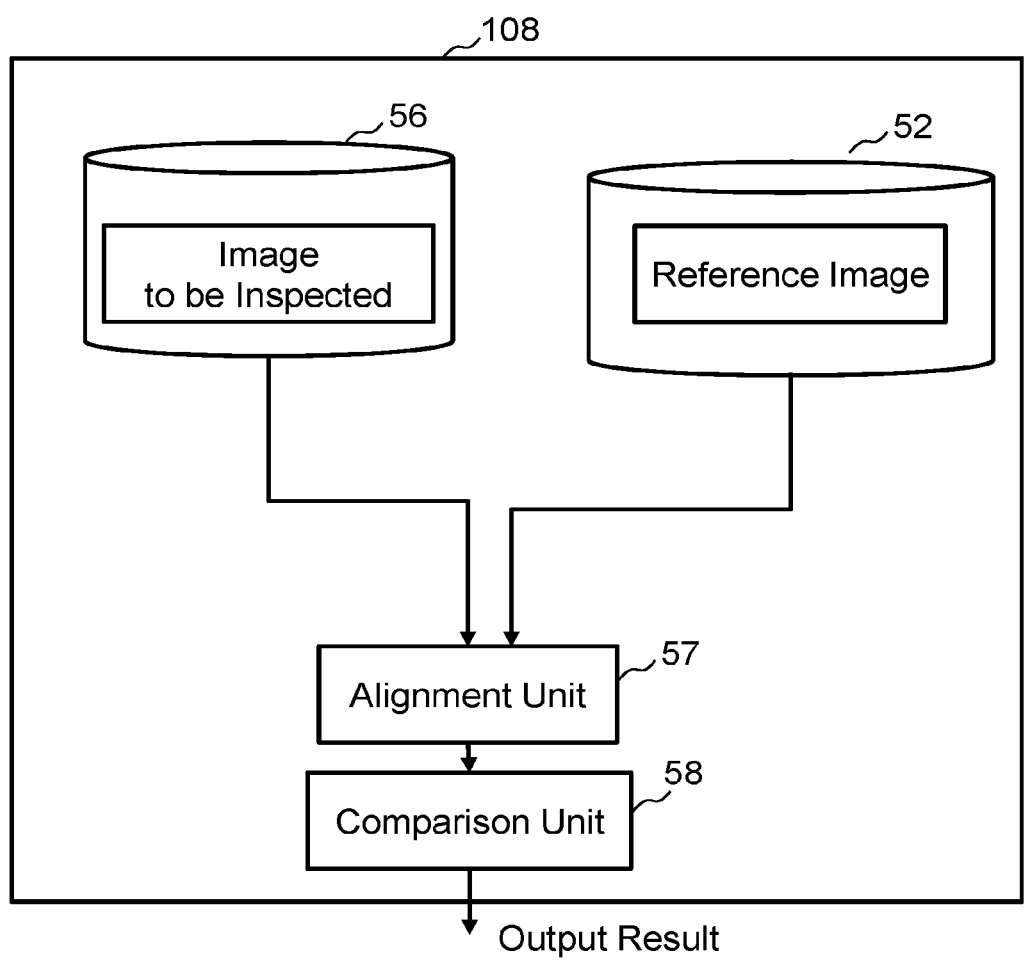
FIG. 11 shows an example of an internal configuration of a comparison circuit according to the first embodiment.

FIG. 11 shows an example of an internal configuration of a comparison circuit according to the first embodiment. In FIG. 11, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the alignment unit 57 and the comparison unit 58, and calculated results are stored in a memory (not shown) or in the memory 118 each time.

According to the first embodiment, the sub-irradiation region 29 acquired by the scanning operation of one primary electron beam 10 is further divided into a plurality of mask die regions. The mask die region is used as a unit region of an image to be inspected. In order to prevent missing an image, it is preferable that the margin region of each mask die region overlaps each other.

In the comparison circuit 108, transmitted secondary electron image data having been corrected is temporarily stored in the storage device 56, as a mask die image (inspection image to be inspected) of each mask die region. Similarly, transmitted reference image data is temporarily stored in the storage device 52 as a reference image for each mask die region.

In the alignment step (S120), the alignment unit 57 reads a mask die image serving as an inspection image, and a reference image corresponding to the mask die image, and provides alignment between the images based on units of sub-pixels smaller than units of pixels. For example, the alignment can be performed by a least-square method.

In the comparison step (S122), the comparison unit 58 compares the mask die image (corrected secondary electron image) and the reference image concerned (an example of a predetermined image). In other words, the comparison unit 58 compares, for each pixel, reference image data with secondary electron image data. The comparison unit 58 compares them, for each pixel, based on predetermined determination conditions in order to determine whether there is a defect such as a shape defect. For example, if a gray scale level difference of each pixel is larger than a determination threshold Th, it is determined that there is a defect. Then, the comparison result is output. It may be output specifically to the storage device 109, the monitor 117, or the memory 118, or alternatively, output from the printer 119.

In the example described above, the die-to-database inspection is performed. However, it is not limited thereto. Since a crosstalk image component has been removed from the inspection image, the die-to-die inspection may be conducted. Now, the case of performing the die-to-die inspection will be described.

In the alignment step (S120), the alignment unit 57 reads a mask die image (image to be inspected) of the die 1 and a mask die image (image to be inspected) of the die 2 on which the same pattern as that of the die 1 is formed, and provides alignment between both the images, based on units of sub-pixels smaller than units of pixels. For example, the alignment can be performed using a least-squares method.

In the comparison step (S122), the comparison unit 58 compares the mask die image (image to be inspected) of the die 1 with the mask die image (image to be inspected) of the die 2. The comparison unit 58 compares them, for each pixel, based on predetermined determination conditions in order to determine whether there is a defect such as a shape defect. For example, if a gray scale level difference of each pixel is larger than the determination threshold Th, it is determined that there is a defect. Then, the comparison result is output. It is output specifically to the storage device 109, the monitor 117, or the memory 118.

As described above, according to the first embodiment, since an image is acquired in the state where the height position of the substrate has been highly accurately adjusted, inspection can be performed with high accuracy.

Figure 12:
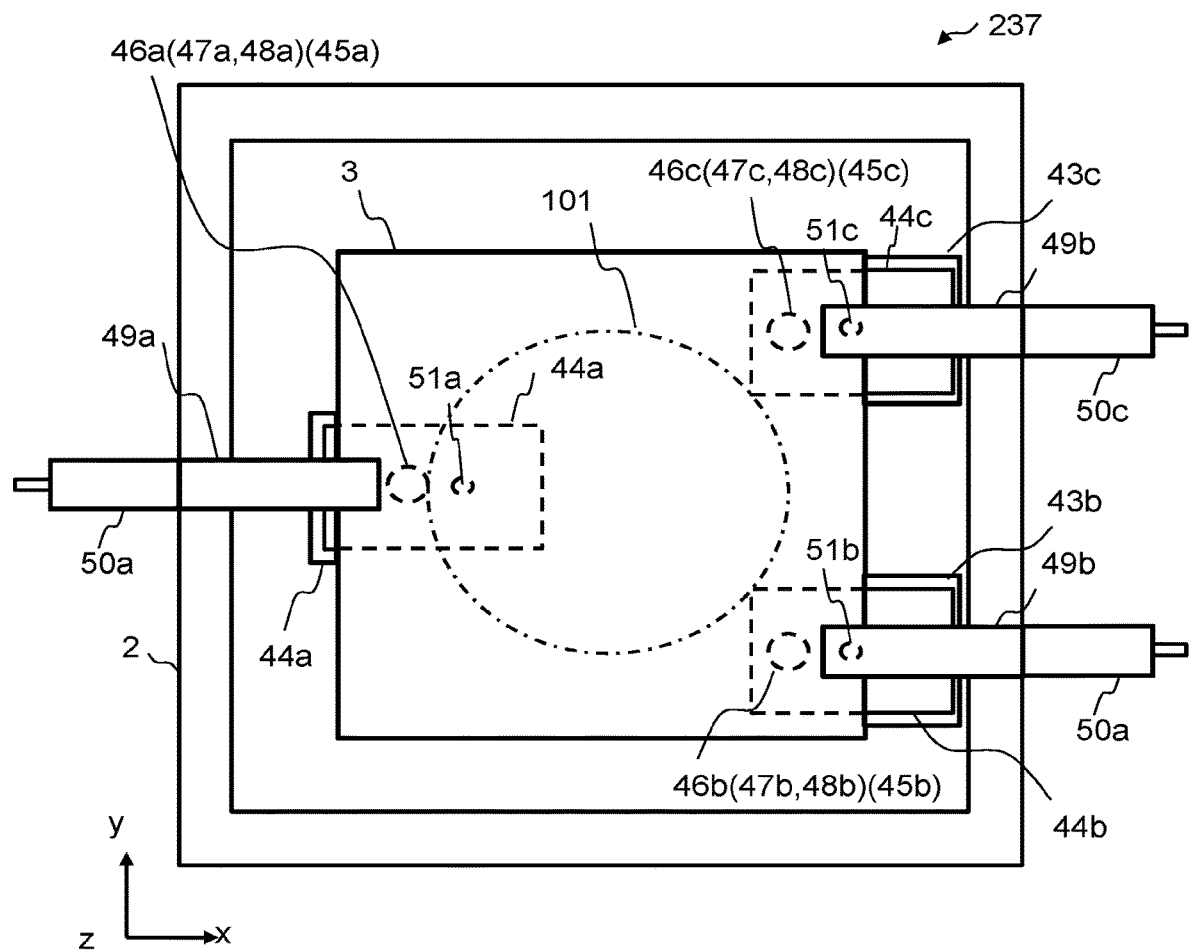
FIG. 12 is a top view showing another example of a Z stage according to the first embodiment.

FIG. 12 is a top view showing another example of a Z stage according to the first embodiment. FIG. 12 is the same as FIG. 6 except that the wedges 44a, 44b, and 44c are individually arranged on the plates 43a, 43b and 43c, and the wedges 44a, 44b, and 44c are independently driven by corresponding actuators 50a, 50b, and 50c through corresponding plates 43a, 43b, and 43c, and that the displacement sensors 51a, 51b, and 51c are individually disposed on the back side of the table 3 such that they are above corresponding inclined surfaces of the wedges 44a, 44b, and 44c. It is also preferable that gradients of the table 3 and further of the substrate 101 are calculated from measured values by the three displacement sensors 51a, 51b, and 51c, and the actuators 50a, 50b, and 50c independently adjust their driving amounts so as to correct the calculated gradients.

Figure 13:
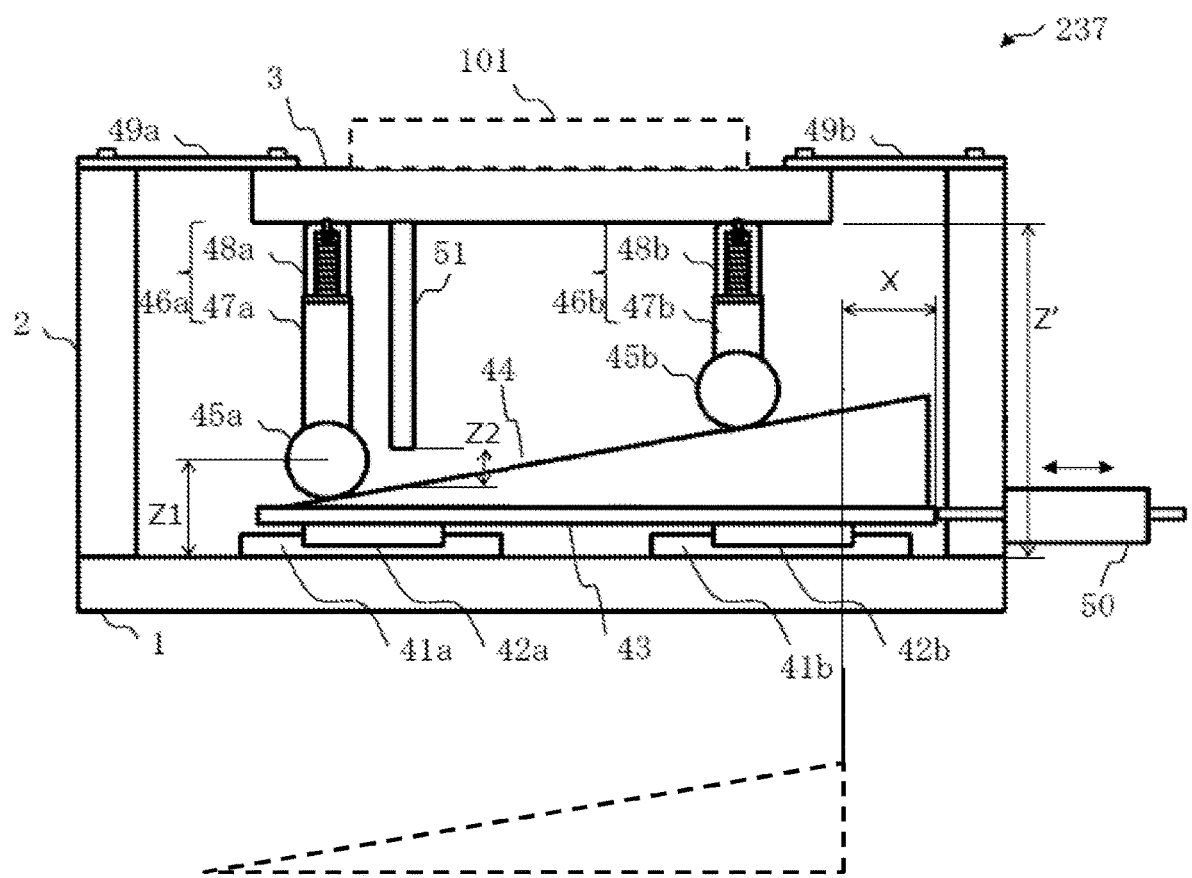
FIG. 13 shows an example of a configuration of a Z stage according to a modification of the first embodiment.

FIG. 13 shows an example of a configuration of a Z stage according to a modification of the first embodiment. FIG. 13 is the same as FIG. 5A except that three rollers 45a, 45b, and 45c (which is not shown) are disposed on the inclined surface of one wedge 44. Thus, the table 3 may go up and down by horizontal movement of the one wedge 44 for three legs supporting the table 3, for example.

Figure 14:
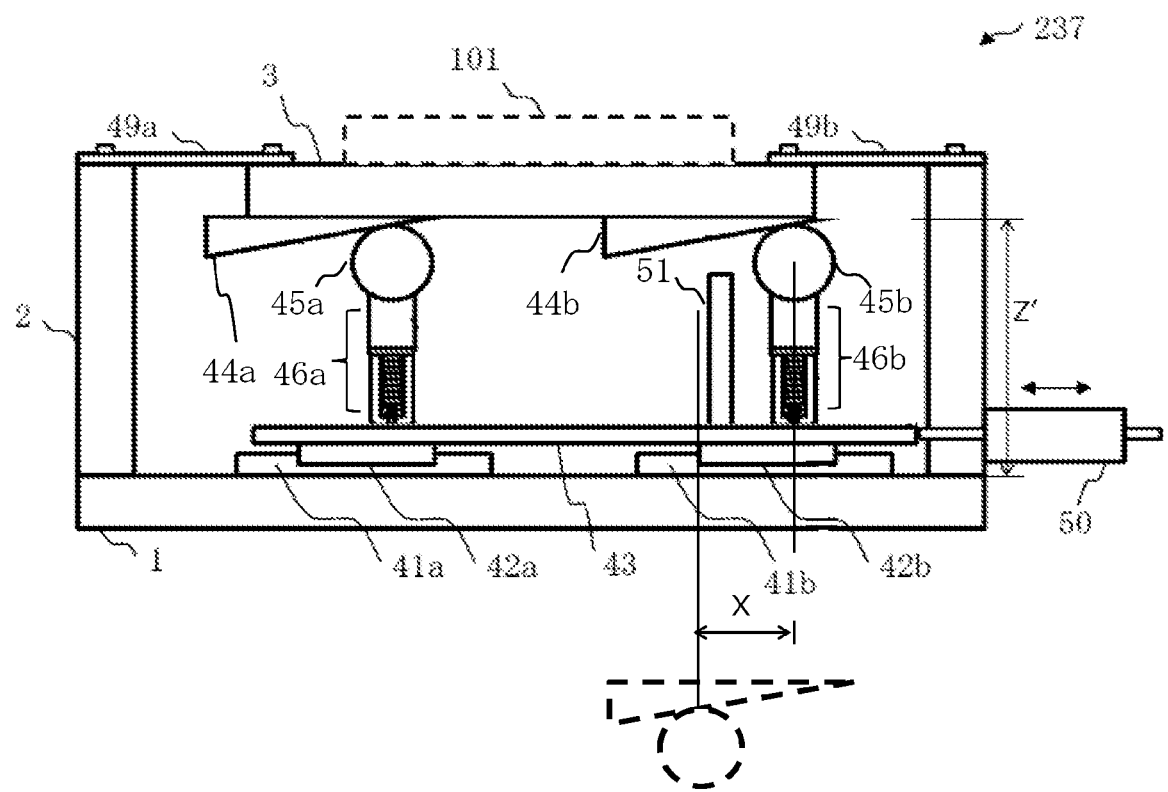
FIG. 14 shows another example of a configuration of a Z stage according to a modification of the first embodiment.

FIG. 14 shows another example of a configuration of a Z stage according to a modification of the first embodiment. In the case of FIG. 14, the wedges 44a, 44b, and 44c with inclined surfaces facing downward are disposed on the backside of the table 3. The fine movement mechanisms 46a, 46b, and 46c are arranged on the plate 43. Each fine movement mechanism 46 supports the roller 45 and the table 3 together from the lower side of each roller 45. The displacement sensor 51 is disposed on the plate 43. Each of the fine movement mechanisms 46a, 46b, and 46c upwardly supports a corresponding one of the rollers 45a, 45b, and 45c. Each of the rollers 45a, 45b, and 45c rolls on the inclined surface of a corresponding one of the wedges 44a, 44b, and 44c. The displacement sensor 51 measures a change of the height position of the inclined surface located above. Other configurations of FIG. 14 are the same as those in FIG. 5A. In the case of FIG. 14, legs each composed of a set of the roller 45a, the axis 47a, and the piezoelectric element 48a, a set of the roller 45b, the axis 47b, and the piezoelectric element 48b, and a set of the roller 45c, the axis 47c, and the piezoelectric element 48c are horizontally moved by the drive of the actuator 50. In such a case, since a plurality of wedges 44a, 44b, and 44c relatively horizontally move with respect to a plurality of rollers 45a, 45b, and 45c, each of the plurality of rollers 45a, 45b, and 45c relatively rolls on the inclined surface of a corresponding one of the plurality of wedges 44a, 44b, and 44c. Thus, the structure between the backside of the table 3 and the plate 43 may be arranged upside down.

Figure 15:
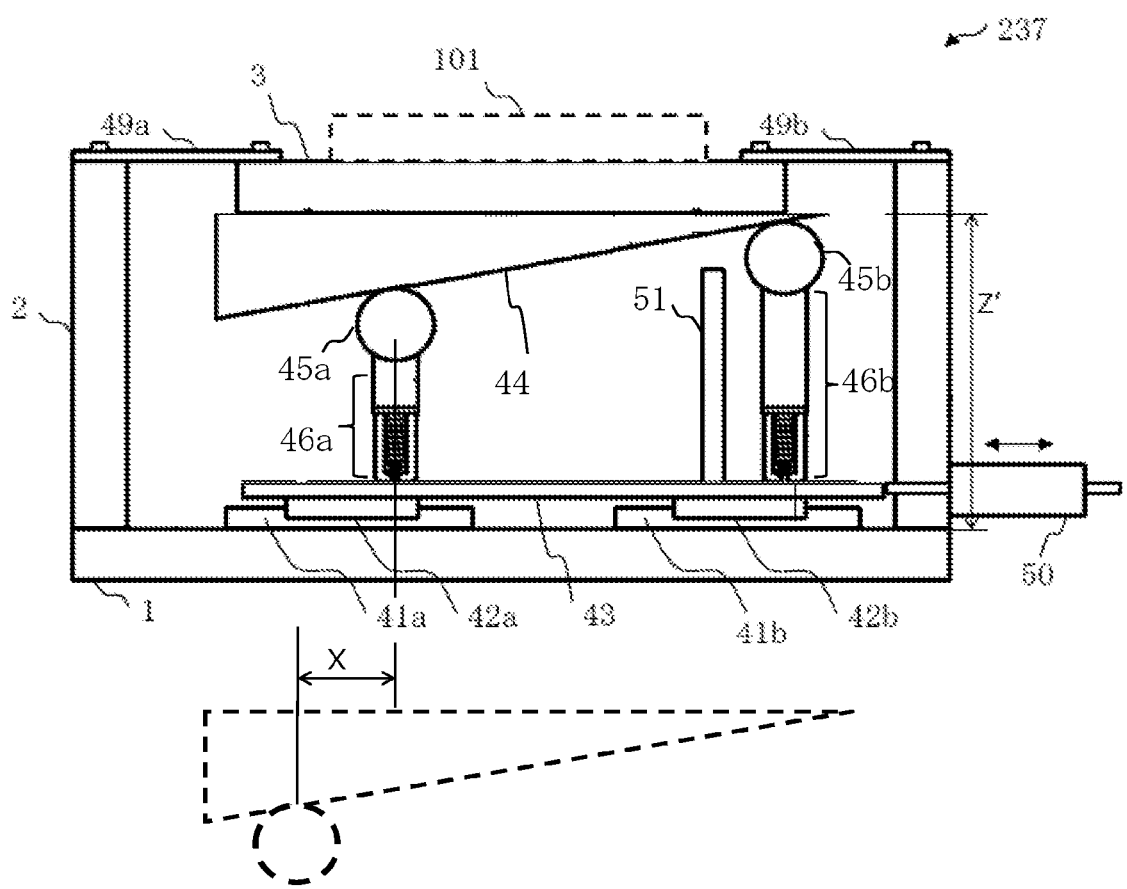
FIG. 15 shows another example of a configuration of a Z stage according to a modification of the first embodiment.

FIG. 15 shows another example of a configuration of a Z stage according to a modification of the first embodiment. FIG. 15 is the same as FIG. 14 except that the three rollers 45a, 45b and 45c (which is not shown) are disposed on the inclined surface of one wedge 44. Thus, the table 3 may move up and down by, for example, moving up and down the three legs which support the table 3, due to the relative horizontal movement of one wedge 44.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the lens control circuit 124, the blanking control circuit 126, and the deflection control circuit 128 may be configured by at least one processing circuit described above.

Embodiments have been explained referring to specific examples described above. However, the present invention is not limited to these specific examples. Although FIG. 1 describes the case where the multiple primary electron beams 20 are formed by the shaping aperture array substrate 203 irradiated with one beam from one irradiation source, namely, the electron gun 201, it is not limited thereto. The multiple primary electron beams 20 may be formed by individual irradiation with primary electron beams from a plurality of irradiation sources.

While the apparatus configuration, control method, and the like not directly necessary for explaining the present invention are not described, some or all of them can be appropriately selected and used on a case-by-case basis when needed.

In addition, any other stage mechanism and table height position adjustment method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stage mechanism comprising:
    a wedge that is with an inclined surface having a predetermined angle with respect to a horizontal direction;
    a roller that relatively rolls on the inclined surface of the wedge by relative horizontal movement of the wedge;
    a fine movement mechanism that supports the roller, goes up and down in accordance with up and down movement of the roller which relatively rolls on the inclined surfaces by the relative horizontal movement of the wedge, and can go up and down more finely than the up and down movement of the roller;
    a table that is supported by the fine movement mechanism; and
    an elastic body that is connected to the table, restrains horizontal movement of the table, and applies an elastic force, in at least one of upward and downward directions, to the table.

2. The stage mechanism according to claim 1, further comprising:
    a displacement sensor that measures displacement in a height direction between a predetermined position of the table and the inclined surface of the wedge.

3. The stage mechanism according to claim 1, wherein the fine movement mechanism includes an axis supporting the roller, and a piezoelectric element arranged on the axis.

4. The stage mechanism according to claim 1, wherein the fine movement mechanism supports the roller from an upper side of the roller, and the table from a lower side of the table.

5. The stage mechanism according to claim 1, wherein the wedge is disposed on a lower surface of the table, and the fine movement mechanisms support the roller and the table together from a lower side of the roller.

6. A stage mechanism comprising:
    a plurality of wedges each with an inclined surface having a predetermined angle with respect to a horizontal direction;
    a plurality of rollers each relatively rolling on the inclined surface of corresponding one of the plurality of wedges by relative horizontal movement of the plurality of wedge;
    a plurality of fine movement mechanisms that support the plurality of rollers one by one, go up and down in accordance with up and down movements of the plurality of rollers each relatively rolling on the inclined surface by the relative horizontal movement of the plurality of wedges, and can go up and down more finely than the up and down movements of the plurality of rollers;

a table supported by the plurality of fine movement mechanisms; and a plurality of elastic bodies that are connected to the table, restrain horizontal movement of the table, and apply elastic force, in at least one of upward and downward directions, to the table.

7. The stage mechanism according to claim 6, wherein the plurality of wedges are disposed facing in a same direction, further comprising:

a drive mechanism that horizontally moves the plurality of wedges together.

8. The stage mechanism according to claim 6, further comprising:

a displacement sensor that measures displacement in a height direction between a predetermined position of the table and the inclined surface of one of the plurality of wedges.

9. A table height position adjustment method comprising:

coarsely adjusting a height position of a table disposed above a roller, by up and down movement of the roller, resulting from a wedge moving horizontally and relative rolling of the roller on an inclined surface of the wedge having a predetermined inclined angle with respect to a horizontal direction;

measuring displacement in a height direction between a predetermined position of the table and the inclined surface of the wedge; and finely adjusting the height position of the table by driving, according to a measured displacement, a fine movement mechanism which is disposed between the roller and the table and can move up and down more finely than the up and down movement of the roller.

10. The method according to claim 9, wherein the finely adjusting the height position of the table is performed by the fine movement mechanism which is finely moving up and down with the up and down movement of the roller.

* * * * *